(12) United States Patent
Cotte et al.

(10) Patent No.: US 7,843,067 B2
(45) Date of Patent: Nov. 30, 2010

(54) METHOD AND STRUCTURE OF INTEGRATED RHODIUM CONTACTS WITH COPPER INTERCONNECTS

(75) Inventors: John M. Cotte, New Fairfield, CT (US); Balasubramanian Haran, Watervliet, NY (US); Christopher C. Parks, Poughkeepsie, NY (US); Xiaoyan Shao, Yorktown Heights, NY (US); Eva E. Simonyi, Bronx, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 12/053,969

(22) Filed: Mar. 24, 2008

(65) Prior Publication Data

US 2009/0239062 A1    Sep. 24, 2009

(51) Int. Cl.
*H01L 23/48* (2006.01)

(52) U.S. Cl. .......... 257/762; 257/414; 438/630
(58) Field of Classification Search .......... 257/414, 257/762; 438/630
See application file for complete search history.

(56) References Cited

U.S. PATENT DOCUMENTS 6,787,912 B2 *  9/2004  Lane et al. .......... 257/762
7,405,154 B2 *  7/2008  Cabral et al. .......... 438/630

* cited by examiner

*Primary Examiner*—Douglas M Menz
(74) *Attorney, Agent, or Firm*—Connolly Bowe Lodge & Hutz LLP

(57) ABSTRACT

The present disclosure relates to a microelectronic structure and the manufacture of the microelectronic structure. Specifically, the disclosure relates to an interconnect barrier layer between a rhodium contact structure and a copper interconnect structure in a microelectronic structure. The microelectronic structure provides for low resistance in microelectronic devices.

20 Claims, 4 Drawing Sheets

METHOD AND STRUCTURE OF INTEGRATED RHODIUM CONTACTS WITH COPPER INTERCONNECTS

TECHNICAL FIELD

The present disclosure relates to a microelectronic structure and the manufacture of the microelectronic structure. Specifically, the disclosure relates to an interconnect barrier layer between a rhodium contact structure and a copper interconnect structure in a microelectronic structure. The microelectronic structure provides for low resistance in microelectronic devices.

BACKGROUND

Advances in the field of interconnect and device technology has, over the years, played an important role in allowing continued scaling of microelectronic products. However, the increasing parasitic resistance in the nanometer regime increasingly degrades the high performance of these devices. Beyond the 32 nm Technology Node, predictions show the middle of the line (MOL) interconnection parasitic resistance contributor will become a key issue due to its high resistance. At the 32 nm and beyond technology nodes innovative solutions based on new materials and new processes have to be implemented to decrease the MOL total plug resistance. Electroplated Rh metallurgy has shown to be a promising alternative MOL technology to replace high resistivity chemical vapor deposition (CVD) tungsten (W) for 32 nm technology and beyond (I. Shao et al., IEEE proceedings of the 2007 International Interconnect Technology Conference (IITC), p 102-104 (2007). Electroplating of Rhodium (Rh) is demonstrated to have a robust process window, extendibility to 32 nm CMOS technology node and beyond, and a lower MOL resistance as compared to CVD W metallurgy. Iwasaki et al., (U.S. Publication No. 2002/0053741) describes a semiconductor device that may contain Rh (FIG. 7) layers on either side of a Cu layer. This construction reportedly gives a low resistivity interconnect. However, we discovered that, when put in direct contact, Rh and Cu diffuse into each other and this diffusion dramatically increases the resistivity of both a Rh seed and Cu line.

SUMMARY OF DISCLOSURE

The present disclosure relates to a microelectronic structure that contains at least a contact structure, an interconnect barrier structure and an interconnect layer. The contact structure contains a rhodium layer and the interconnect layer contains a copper layer. The interconnect barrier structure is placed between the rhodium and copper layers to minimize the interaction between the rhodium and copper. Other layers may be present depending upon the device application.

The contact structure contains a silicide layer, a dielectric layer, a contact layer, optionally a contact barrier layer, an optional seed layer and a rhodium fill layer.

The interconnect barrier layer may be one or more of a layer of Ta, TaN, Ti, TiN, W, WN, Mo, and MoN.

The interconnect layer contains a copper layer and an interconnect dielectric layer.

The disclosure also relates to a process for the manufacture of the microelectronic structure and to electrical circuits and integrated circuits containing the microelectronic structure.

DESCRIPTION OF BEST AND VARIOUS MODES

We have discovered that a interconnect structure containing a layer of Cu and a layer of Rh in direct contact is highly unstable in the back-end-of-the line (BEOL) thermal budget. Specifically, the resistivity of the two layers increases significantly when annealed. This increase in resistivity is shown in Table 1 which lists the resistivity of a 50 nm Cu layer on top of a 50 nm Rh layer before (as deposited) and after forming gas annealing (FGA) at 400° C. for 10 hours.

TABLE 1

The change in resistivity of a Cu layer and a Rh layer before and after FGA

|  | As Deposited | Post-FGA | % Change |
|---|---|---|---|
| Sheet Resistance (ohm/sq) of Cu Layer | | | |
| 50 nm Cu/50 nm Rh | 0.465 | 1.195 | 157 |
| Sheet Resistance (ohm/sq) of Rh Layer | | | |
| 50 nm Cu/50 nm Rh | 1.857 | 2.066 | 11 |

Figure 1:
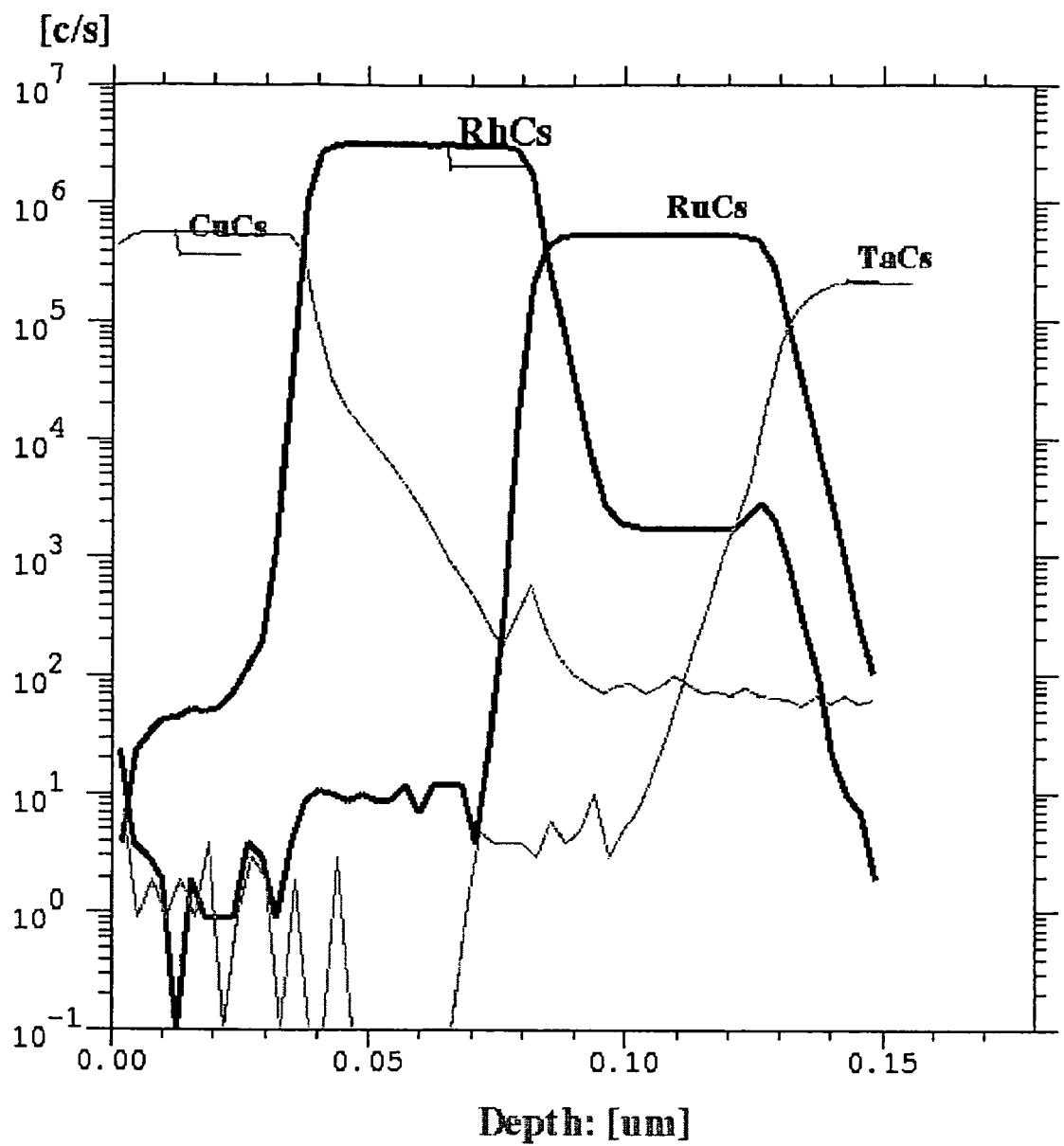
FIG. 1 is a SIMS profile of a 50 nm Cu layer on top of a 50 nm Rh layer on top of a Ru/Ta/Si substrate.
Figure 2:
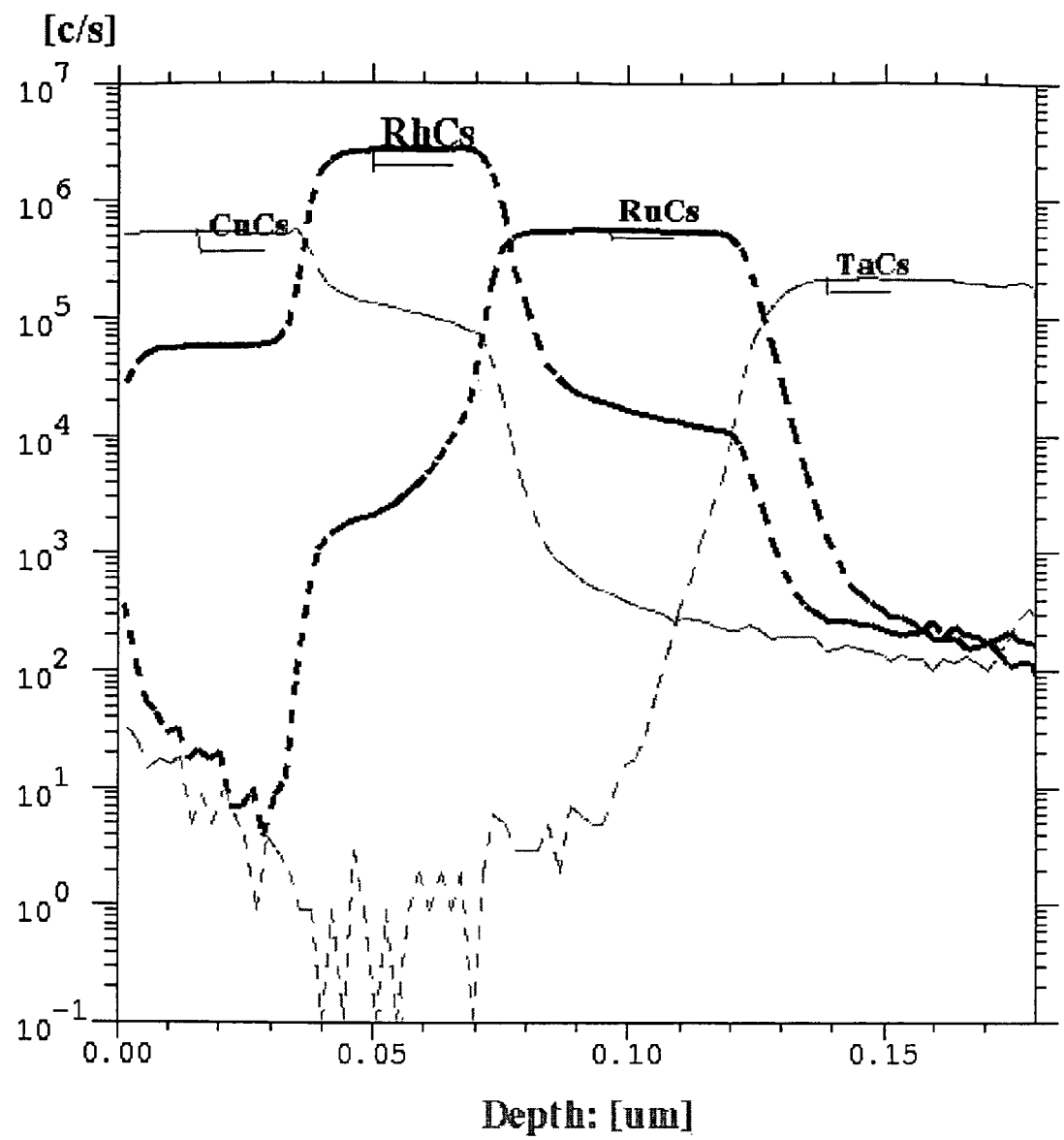
FIG. 2 is a SIMS profile of a 50 nm Cu layer on top of a 50 nm Rh layer on top of a Ru/Ta/Si substrate after 400° C. annealing for 10 hours.
Figure 3:
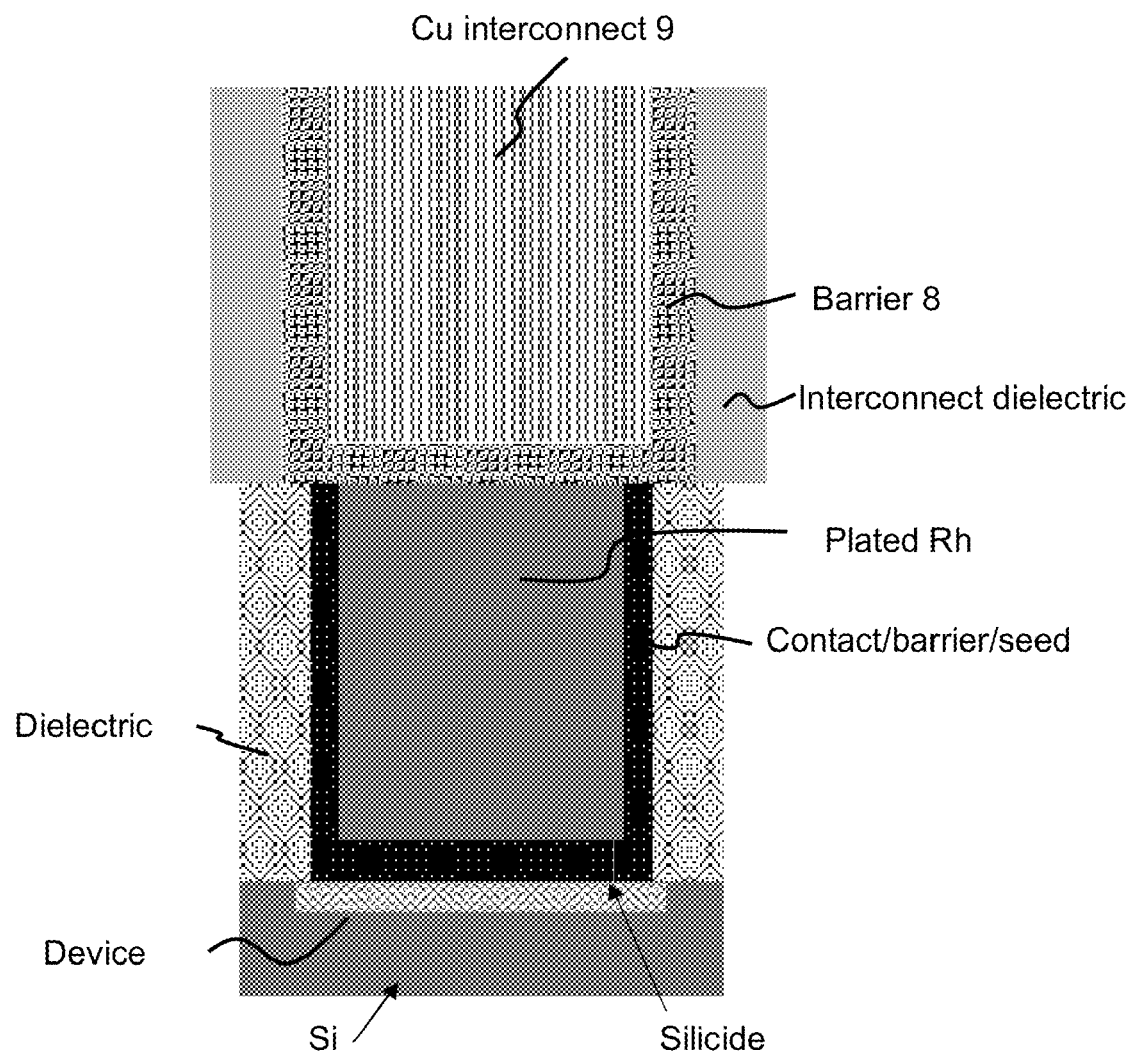
FIG. 3 is an illustration of an embodiment of the disclosed microelectronic structure.

We have discovered that the reason for this increase in resistivity is due to significant interdiffusion between the Cu layer and the Rh layer. This is illustrated in FIGS. 1 and 2 which show SIMS profiles of a 50 nm Cu layer on top of a 50 nm Rh layer on a Ru/Ta/Si substrate before (FIG. 1) and after (FIG. 2) annealing at 400° C. Inspection of FIG. 1 and FIG. 2 shows significant diffusion of Cu into the Rh layer and Rh into the Cu layer after annealing.

We have solved this problem of increased resistivity by placing an interconnect barrier layer between the Cu layer and the Rh layer. The improvement in resistive properties of the Cu and Rh layers with the interconnect barrier layer is shown in Table 2. Here a Ta, TaN or TaN/Ta interconnect barrier layer was placed between the Cu and Rh layer and the samples were treated as describe above in Table 1.

TABLE 2

The change in resistivity of a Cu layer and a Rh layer containing an interconnect barrier layer before and after FGA

|  | As Deposited | Post-FGA | % Change |
|---|---|---|---|
| Sheet Resistance (ohm/sq) of Cu Layer | | | |
| 50 nm Cu/50 nm Rh (no barrier layer) | 0.465 | 1.195 | 157 |
| 50 nm Cu/2 nm TaN/50 nm Rh | 0.446 | 0.655 | 47 |
| 50 nm Cu/4 nm Ta/50 nm Rh | 0.494 | 0.566 | 15 |
| 50 nm Cu/4 nm Ta/2 nm TaN/50 nm Rh | 0.544 | 0.471 | −13 |
| Sheet Resistance (ohm/sq) Rh Layer | | | |
| 50 nm Cu/50 nm Rh (no barrier layer) | 1.857 | 2.066 | 11 |
| 50 nm Cu/2 nm TaN/50 nm Rh | 1.744 | 1.658 | −5 |
| 50 nm Cu/4 nm Ta/50 nm Rh | 1.984 | 2.528 | 27 |
| 50 nm Cu/4 nm Ta/2 nm TaN/50 nm Rh | 2.405 | 2.043 | −15 |

The results summarized in Table 2 show that an interconnect barrier layer between the Cu layer and Rh layer significantly improves the resistivity of these layer after annealing. The various layers described throughout the disclosure may be deposited by any technique known in the literature. Additional examples not described herein may be found in publications such as U.S. Pat. Nos. 5,891,513, 6,294,836, 6,441,492, 7,045,861, U.S. Publication No. 2002/0053741 and U.S. Publication No. 2002/0084529 and U.S. Publication No. 2005/0206000 the contents of which are herein incorporated by reference.

Based on the results described above the disclosed interconnect barrier layer is at least about 2 nm thick and more typically is at the least about 5 nm thick. The interconnect barrier is typically one or more layers of Ta, TaN, Ti, TiN, W, WN, Mo and MoN. The layer may be deposited by any method commonly used in the electronics industry. This includes chemical vapor deposition (CVD), atomic layer deposition (ALD) and sputtering such as physical vapor deposition (PVD) or ionized physical vapor deposition (IPVD).

The silicide layer in the contact structure is typically composed of cobalt silicide or nickel silicide or a combination of these two. The silicide layer is typically from about 5 nm thick to 50 about thick and more typically from about 5 nm thick to about 20 nm thick The silicide is formed by a technique called salicide (self aligned silicide formation) as described in the literature.

The dielectric layer in the contact structure may be any dielectric material used in electronics. This dielectric is typically composed of silicon dioxide, phosphosilicate glass which may be boron doped, tetraethylorthosilicate, SiCH, SiCOH, SiCHN, carbon-doped oxide, organo silicates and organic spin-on polymers. The dielectric layer is typically from about 100 nm to about 1000 nm thick.

The contact layer of the contact structure, is at least one layer typically composed of Ti, TiN, Ta, TaN, W, WN, Mo, and MoN and combination of these. The contact layer is typically from about 2 nm thick to about 20 nm thick. The contact layer is typically deposited as described above for the interconnect barrier layer.

The optional contact barrier layer is composed TiN, TaN, WN, and MoN and the combination of these. The contact barrier layer is typically from about 2 nm thick to about 20 nm thick. The contact layer is typically deposited as described above for the interconnect barrier layer.

The optional seed layer is typically at least one layer composited of Cu, Ru, Rh, Pt, Pd, Ir, Os and Re. The seed layer is typically deposited to a thickness from about 2 nm to about 20 nm. The layer may be deposited by physical vapor deposition, chemical vapor deposition techniques or by electrodeposition techniques.

The Rh metal fill layer is typically deposited by electroplating according to the present disclosure to fill the cavities (e.g. vias or bars). The present invention is especially advantageous when filling high aspects ratio vias or bars. The aspect ratio is typically at between about 2 about 10 and more typically about between 4 and 10.

The vias or bars have a critical dimension (CD) of typically about 30 nm to about 250 nm, and more typically 40 nm to about 100 nm. The present disclosure is especially advantageous for filling submicron vias including having a CD dimension down to about 40 nanometers.

In order to achieve void free and seamless conductor, the rhodium is electroplated using a composition containing a rhodium salt, and acid and a stress reducer. The rhodium salt is typically rhodium sulfate, rhodium phosphate or rhodium chloride and more typically rhodium sulfate. The amount of rhodium salt in the bath is typically about 1 to about 100 grams/liter and more typically about 1 to about 10 grams liters with a specific example being 5 grams/liter.

The bath also includes an acid such as sulfuric acid, hydrochloric acid and phosphoric acid and typically in amounts to provide a pH of about 0. 1 to about 3 and more typically a pH of about 0.5 to about 1.

The stress reducer is typically present in an amount sufficient to provide a void free and/or seamless conductor at the electroplating conditions. Mixtures of different stress reduces can be employed, when desired.

An example of a stress reducing agent is a halide as disclosed in US Patent Publication 2004/247,920, entire disclosure of which is incorporated herein by reference, such as a chloride and, in particular, Group I and II chlorides, $AlCl_3$ and $CrCl_3$. When employed such are typically present in amounts of about 20 ppm to about 5000 ppm in the electroplating bath.

Another example of a stress reducer that can be employed is a rhodium sulfate based solution as disclosed in U.S. Pat. No. 6,241,870 to Abys et al., the entire disclosure of which is incorporate herein by reference, which employs a complex of rhodium sulfate molecules with a minimum of metal to metal boding and with the complex forming predominately via bridged bidentate sufphato groups.

Another group of stress reducer are sulfonic acids such as aromatic sulfonic acids, an example being phenolsulfonic acid as disclosed in U.S. Pat. No. 4,402,802 to Kreuter, the entire disclosure of which is incorporated herein by reference. When employed, such is usually present in amount of about 0.1 to about 5 grams/liters.

Another stress reducer is sulfamic acids as disclosed in U.S. Pat. No. 3,671,408 and U.S. Pat. No. 3,892,638, the entire disclosures of which are incorporated herein by references. When employed, such is typically present in amounts of about 30 grams/liters to about 100 grams/liters.

Another stress reducer is disclosed in U.S. Pat. No. 3,729,396 to Browning et al., the entire disclosure of which is incorporated herein by reference, which is a combination of an aluminum ion, provided by for example aluminum phosphate, and dicarboxylic or polycarboxylic acid such as azelaic acid or pimelic acid. When employed, the aluminum ion is typically present in amount of about 0.05 to about 5 grams per liter and the di-or poly-carboxylic acid is typically present in amount of about 1 to about 25 grams per liter.

Another group of stress reducer are alcohols as disclosed in US Patent Publication 2005/155866 to Gabe, the entire disclosure of which is incorporated herein by reference. Typical alcohols include alkyl, alkenyl, alkynl, aromatic and non-aromatic cyclic alcohols. When employed, the alcohols are typically used in amounts of about 0.001 grams per liter to about 100 grams per liter and more typically about 0.01 grams per liter to about 20 grams per liter.

The electroplating can be carried out using an anode such as Pt or other noble metals, and a cathode, which is the wafer substrate to be plated with a conductive seedlayer. The seed layer as discussed above can be any conductive material. A typical Rh plating chemistry used is from Enthone-EMI, which is composed of three components: the Rhodex® 100 containing the main salt with 5 g/l of Rh metal concentration; the Rhodex® 100 stress reducer, 10% in volume is used; and 3% $H_2SO_4$ in volume. Other commercially available electroplating bath that can be used according to this disclosure include, but are not limited to, Rhodex® bright Rhodium, Technic-Rhodium, and Technic Rhodium S-less.

The electroplating is typically carried out employing a current density of about 1 to about 100 milliamps/cm$^2$ more typically about 1 to about 50 milliamp/cm$^2$ and even more typically about 2 to about 10 milliamps/cm$^2$. Also the electroplating is typically carried out at temperatures of about 10° C. to about 80° C.

The copper layer in the interconnect layer is deposited by a electroplating process to fill cavities such as vias or bars. The copper layer is typically deposited using superconformal filling solutions as published extensively in literature, which typically is composed of copper sulfate as the source for copper, sulfuric acid in the concentration range from 5 g/l to 200 g/l, a trace amount of chloride in the range of 10 ppm to 500 ppm, a brightener also called accelerator additive, a suppressor additive, and optionally a leveler additive. The typical dimensions for copper electroplating are between about 20 nm and about 2000 nm. The aspect ratio is from about 0.5 to about 10. The electroplating is typically carried out employing a current waveform of about 1 to about 100 milliamps/cm$^2$ more typically from about 2 to 50 milliamps/cm$^2$. In addition, the electroplating is typically carried out at temperatures of about 10° C. to about 80° C.

The interconnect dielectric layer is composed of deposited as a descired above or in the references publications. The dielectric layer is typically from about 50 nm to about 5000 nm in thickness.

Figure 4:
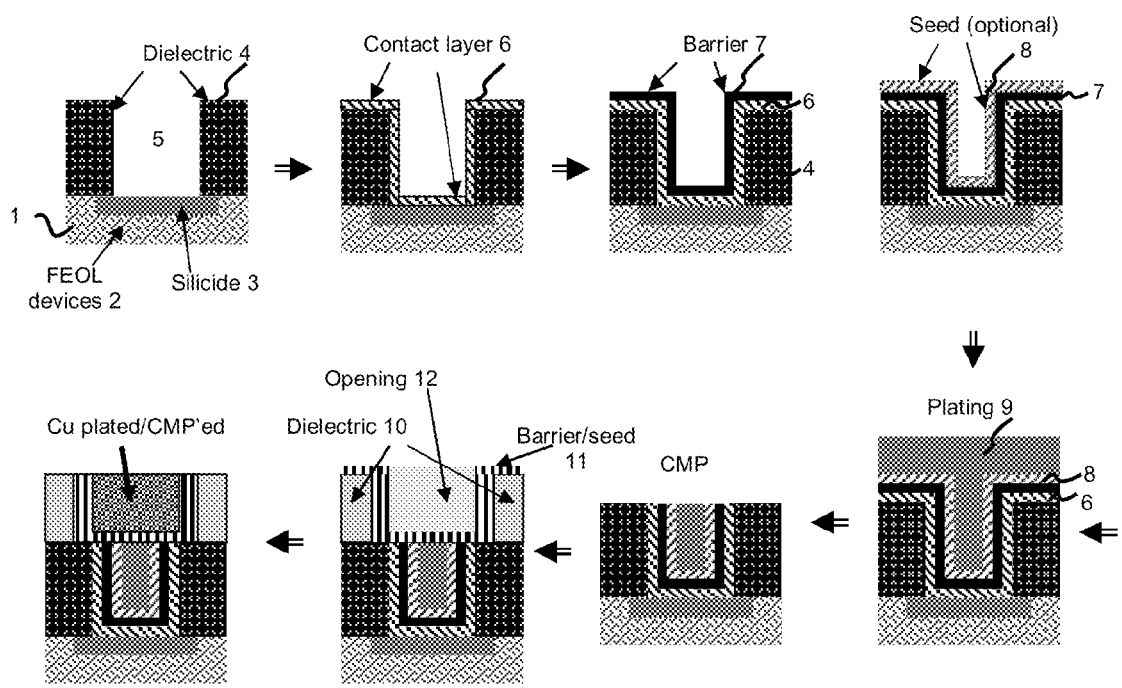
FIG. 4 is an illustration of an embodiment of the disclosed process for manufacturing the microelectronic structure.

The disclosed microelectronic structure is produced by depositing the individual layer as discussed above. Additional layers and various configurations are utilized an needed for each specific microelectronic structure or device. One embodiment of the discussed methods for producing the microelectronic structure is shown in FIG. 4. The method includes:

providing a device,
depositing the silicide layer on the device,
depositing the dielectric layer on the silicide layer,
creating a first via in the dielectric layer to expose the silicide layer,
depositing the contact layer on the dielectric layer and in the first via,
optionally depositing the contact barrier layer on the contact layer,
optionally depositing the seed layer on the contact barrier layer,
plating the seed layer and first via with the Rh metal fill layer forming an unfinished contact structure,
planarizing the unfinished contact structure to expose the contact layer, the optional contact barrier layer, the seed layer, the Rh metal fill layer and the dielectric layer to form the contact structure,
depositing the interconnect dielectric layer on the contact structure,
creating a second via in the interconnect dielectric layer to expose the Rh metal fill layer, the optional contact barrier layer, the seed layer and the dielectric layer,
depositing the interconnect barrier layer in the second via and on the interconnect dielectric layer,
depositing the copper layer to fill the second via and to form an unfinished microelectronic structure and,
planarizing the unfinished microelectronic structure to expose the interconnect dielectric layer, interconnect barrier layer and the copper layer to form the microelectronic structure.

The embodiment described in FIG. 4 does not limit additional embodiments.

The following example is for illustrative purposes and does not limit the scope of the disclosure.

A via pattern is created using ebeam lithography in a MOL dielectric layer (BPSG, PSG, or other dielectrics), followed by a thin deposition of atomic layer deposition (ALD) of TaN and ALD of ruthenium. Rhodium is electroplated from a commercial bath containing Enthone Rhodex 100 using constant current control to give 5 mA/cm2.

Subsequently, the excess Rh is removed either mechanically, by CMP (chemicalmechanical polishing), or by physical methods (such as sputter etch, RIE, . . . ).

Next, a layer of BEOL dielectric layer is deposited and patterned to have lines/vias connected to the Rh vias underneath.

A thin stack of TaN/Ta/Cu layers are then deposited by PVD or IPVD methods. Typically, the combined thickness of TaN/Ta is more than 6 nm. More typically, 8 nm and 15 nm total liner thickness are used for the samples. The TaN/Ta is left on both the bottom of the trenches and on the sidewalls and field areas of the patterns. Cu is then plated up and polished. The TaN/Ta/Cu layer structure process is repeated multiple times. Sputter etch is used to remove TaN/Ta on the bottom of the subsequent layer of Cu to make a low resistance contact to the underneath Cu interconnects to finish the BEOL.

The term "comprising" (and its grammatical variations) as used herein is used in the inclusive sense of "having" or "including" and not in the exclusive sense of "consisting only of". The term "a" and "the" as used herein are understood to encompass the plural as well as the singular.

The foregoing description illustrates and describes the present disclosure. Additionally, the disclosure shows and describes only the preferred embodiments of the disclosure, but, as mentioned above, it is to be understood that it is capable of changes or modifications within the scope of the concept as expressed herein, commensurate with the above teachings and/or skill or knowledge of the relevant art. The described hereinabove are further intended to explain best modes known of practicing the invention and to enable others skilled in the art to utilize the disclosure in such, or other embodiments and with the various modifications required by the particular applications or uses disclosed herein. Accordingly, the description is not intended to limit the invention to the form disclosed herein. Also it is intended that the appended claims be construed to include alternative embodiments.

All publications, patents and patent application cited in the specification are herein incorporated by reference, and for any and all purposes, as if each individual publication, patent or patent application were specifically and individually indicates to be incorporated by reference. In this case of inconsistencies, the present disclosure will prevail.

The invention claimed is:

1. A microelectronic structure comprising:
a contact structure;
an interconnect barrier layer; and
an interconnect layer, wherein the contact structure comprises:
a silicide layer;
a dielectric layer;
a contact layer;
optionally a contact barrier layer;
optionally a seed layer; and
a Rh metal fill layer, wherein
the interconnect barriers layer is at least one layer selected from the group consisting of Ta, TaN, Ti, TiN, W, WN, Mo, MoN and combinations of these layers,
wherein the interconnect layer comprises a copper layer and an interconnect dielectric and wherein the interconnect barrier layer is between the Rh metal fill layer and the copper layer.

2. The microelectronic structure as claimed in claim 1, wherein the interconnect barrier layer is at least 2 nm thick.

3. The microelectronic structure as claimed in claim 1, wherein the interconnect barrier layer is at least 5 nm thick.

4. An electrical circuit comprising the microelectronic structure as claimed in claim 1.

5. An integrated circuit comprising the microelectronic structure as claimed in claim 1.

6. The microelectronic structure as claimed in claim 1, wherein the silicide layer is a cobalt silicide or a nickel silicide layer.

7. The microelectronic structure as claimed in claim 1, wherein the dielectric layer is a silicon oxide or a silicon nitride layer.

8. The microelectronic structure as claimed in claim 1, wherein the contact layer is a Ti, a TiN or a Ti/TiN layer.

9. The microelectronics structure as claimed in claim 1, wherein the optional contact barrier layer is present and the contact barrier layer is TiN, TaN, WN, MoN, or a combination of these.

10. The microelectronic structure as claimed in claim 1, herein the optional seed layer is present and the seed layer is at least one selected from the group consisting of Cu, Ru, Rh, Pt, Pd, Ir, Os and Re.

11. A method for producing the microelectronic structure as claimed in claim 1 comprising:
   a. providing a device;
   b. depositing the silicide layer on the device;
   c. depositing the dielectric layer on the silicide layer;
   d. creating a first via in the dielectric layer to expose the silicide layer;
   e. depositing the contact layer on the dielectric layer and in the first via;
   f. optionally depositing the contact barrier layer on the contact layer;
   g. optionally depositing the seed layer on the contact barrier layer;
   h. plating the seed layer and first via with the Rh metal fill layer forming an unfinished contact structure;
   i. planarizing the unfinished contact structure to expose the contact layer, the optional contact barrier layer, the seed layer, the Rh metal fill layer and the dielectric layer to form the contact structure;
   j. depositing the interconnect dielectric layer on the contact structure;
   k. creating a second via in the interconnect dielectric layer to expose the Rh metal fill layer, the optional contact barrier layer, the seed layer and the dielectric layer;
   l. depositing the interconnect barrier layer in the second via and on the interconnect dielectric layer;
   m. depositing the copper layer to fill the second via and to form an unfinished microelectronic structure and;
   n. planarizing the unfinished microelectronic structure to expose the interconnect dielectric layer, interconnect barrier layer and the copper layer to form the microelectronic structure.

12. The method as claimed in claim 11, wherein the interconnect barrier layer is at least 2 nm thick.

13. The method as claimed in claim 11, wherein the interconnect barrier layer is at least 5 nm thick.

14. An electrical circuit by comprising the microelectronic structure produced according to claim 11.

15. An integrated circuit comprising the microelectronic structure produced according to claim 11.

16. The method as claimed in claim 11, wherein the silicide layer is a cobalt silicide or a nickel silicide layer.

17. The method as claimed in claim 11, wherein microelectronic structure as claimed in claim 1, wherein the dielectric layer is a silicon oxide or a silicon nitride layer.

18. The method as claimed in claim 11, wherein the microelectronic structure as claimed in claim 1, wherein the contact layer is a Ti, a TiN or a Ti/TiN layer.

19. The method as claimed in claim 11, wherein the optional contact barrier layer is deposited and the contact barrier layer is TiN, TaN, WN, MoN, or a combination of these.

20. The method as claimed in claim 11, wherein the optional seed layer is deposited and the seed layer is at least one selected from the group consisting of Cu, Ru, Rh, Pt, Pd, Ir, Os and Re.

* * * * *